United States Patent
Kim et al.

(10) Patent No.: US 9,043,346 B2
(45) Date of Patent: May 26, 2015

(54) METHOD OF PROVIDING DATA INCLUDED IN BUILDING INFORMATION MODELING DATA FILE, RECORDING MEDIUM THEREFOR, SYSTEM USING THE METHOD, AND METHOD OF PROVIDING DATA USING BUILDING INFORMATION MODELING SERVER

(71) Applicant: SOLIDEO SYSTEMS CO., LTD., Seoul (KR)

(72) Inventors: Sook Hee Kim, Seoul (KR); Joo Seok Kang, Suwon-si (KR); Sung Han Lee, Seoul (KR); Jong Hyun Choi, Goyang-si (KR); Sang Ok Byun, Gwangmyeong-si (KR)

(73) Assignee: SOLIDEO SYSTEMS CO., LTD. (KR)

( * ) Notice: Subject to any disclaimer, the term of this patent is extended or adjusted under 35 U.S.C. 154(b) by 36 days.

(21) Appl. No.: 13/664,534

(22) Filed: Oct. 31, 2012

(65) Prior Publication Data
US 2013/0218924 A1  Aug. 22, 2013

(30) Foreign Application Priority Data

Feb. 20, 2012 (KR) .................. 10-2012-0016827
May 16, 2012 (KR) .................. 10-2012-0052114

(51) Int. Cl.
*G06F 17/30* (2006.01)
*G06F 17/50* (2006.01)
*G06Q 10/06* (2012.01)

(52) U.S. Cl.
CPC ...... *G06F 17/30569* (2013.01); *G06F 17/5004* (2013.01); *G06Q 10/06* (2013.01)

(58) Field of Classification Search
CPC ................. G06F 17/30569; G06F 13/5004
USPC .......................................................... 707/602
See application file for complete search history.

(56) References Cited

U.S. PATENT DOCUMENTS

| | | | |
|---|---|---|---|
| 2011/0093424 A1* | 4/2011 | Zimmermann et al. | 706/47 |
| 2011/0133884 A1 | 6/2011 | Kumar et al. | |
| 2012/0066178 A1* | 3/2012 | Omansky et al. | 707/626 |

FOREIGN PATENT DOCUMENTS

| | | |
|---|---|---|
| GB | 2475959 | 6/2011 |
| JP | 2011081642 | 4/2011 |

OTHER PUBLICATIONS

Y. S. Jeong et al., Benchmark tests for BIM data exchanges of precast concrete, Automation in Construction, 2009, pp. 469-484.
European Search Report—European Application No. 12194933.3 issued on Jun. 26, 2013 citing GB 2 475 959, Jeong Y S et al., "Benchmark tests for BIM data exchanges of precast concrete" and US 2011/093424.

(Continued)

*Primary Examiner* — William Spieler
(74) *Attorney, Agent, or Firm* — Cantor Colburn LLP

(57) ABSTRACT

A method of providing data included in a building information modeling (BIM) data file using a server is provided. The method includes retrieving mapping data corresponding to a user request, extracting data corresponding to at least one entity mapped to the mapping data from the BIM data file, and transmitting the extracted data to a client.

7 Claims, 12 Drawing Sheets

(56) References Cited

OTHER PUBLICATIONS

Miwako Doi, "Utilization of Position Information and Innovation in Utilization Using Distribution-Robot Service", Ohm Press, Japan, First edition, Nov. 20, 2010, pp. 96-102.

Japanese Office Action—Japanese Application No. 2012-239129 issued on Feb. 18, 2014, citing JP 2011-81642 and Miwako Doi, "Utilization of Position Information and Innovation in Utilization Using Distribution-Robot Service", Ohm Press, Japan, First edition, Nov. 20, 2010, pp. 96-102.

* cited by examiner

METHOD OF PROVIDING DATA INCLUDED IN BUILDING INFORMATION MODELING DATA FILE, RECORDING MEDIUM THEREFOR, SYSTEM USING THE METHOD, AND METHOD OF PROVIDING DATA USING BUILDING INFORMATION MODELING SERVER

CROSS-REFERENCE TO RELATED APPLICATIONS

This application claims priorities under 35 U.S.C. §119(a) to Korean Patent Application No. 10-2012-0016827, filed on Feb. 20, 2012, and Korean Patent Application No. 10-2012-0052114, filed on May 16, 2012, and all the benefits accruing therefrom under 35 U.S.C. §119, the content of which is hereby incorporated by reference in their entirety.

BACKGROUND

1. Field

Embodiments of the inventive concept relate to methods of providing data included in a building information modeling (BIM) data file, systems using the same, and methods of providing data using a BIM server, and more particularly, to methods of extracting requested data from a BIM data file using mapping data and providing the requested data, systems using the same, and methods of providing data showing a result of simulating a building corresponding to a client request.

2. Description of the Related Art

A building information modeling (BIM) is a process of implementing planning, designing, engineering, construction, or maintenance of a building in a multi-dimensional virtual space.

Industry foundation classes (IFC) is an international standard building information model developed to facilitate compatibility of data, which may be used in different formats by participants in an architecture, engineering and construction/facility management (AEC/FM) project. Although a BIM data file, e.g., a file in an IFC format, may contain a lot of information about a building, it has a large size. Accordingly, a server-level memory is required to load the file.

When the file is transferred to a client, it requires a longer time for the client to receive the file. Moreover, it requires a longer time for the client to load or render the file.

SUMMARY

Some embodiments of the inventive concept provide methods of extracting a requested data from a building information modeling (BIM) data file using mapping data and providing the requested data and systems using the same. Some embodiments of the inventive concept also provide methods of transmitting data or a BIM data file related to a building corresponding to a client request to an application provider corresponding to the client request and providing result data received from the application provider to a client using a BIM server.

According to an aspect of the inventive concept, provided is a method of providing data included in a BIM data file using a server, which includes a database storing the BIM data file including a plurality of entities in a hierarchical structure and mapping data mapped to at least one of the plurality of the entities. The method includes receiving a user request from a client, retrieving mapping data corresponding to the user request from the database based on the user request, extracting data corresponding to at least one entity mapped to the mapping data from the BIM data file, and transmitting the extracted data to the client.

The at least one entity mapped to the mapping data may include an upper entity and a lower entity associated with the upper entity, and the upper entity and the lower entity may be in the hierarchical structure. The user request may include application information regarding an application executed by the client, and the mapping data may be retrieved based on the application information.

The at least one entity mapped to the mapping data may include a first upper entity, a second upper entity, a plurality of first lower entities associated with the first upper entity, and a plurality of second lower entities associated with the second upper entity. The extracting may includes comparing the first lower entities with the second lower entities, and data corresponding to an overlapping entity between the first and the second lower entities according to a comparison result is not extracted repeatedly.

The method may further include generating an industry foundation classes (IFC) file including the extracted data. The transmitting may include the transmission module transmitting the IFC file to the client.

According to another aspect of the inventive concept, provided is a non-transitory computer readable medium storing a computer program for performing the above-described method.

According to still another aspect of the inventive concept, provided is a BIM data providing system including a client configured to generate a user request including application information regarding an application to be executed and a server configured to transmit a response corresponding to the user request to the client. The server includes a database configured to store a BIM data file including a plurality of entities in a hierarchical structure and mapping data mapped to at least one of the entities, a receiving module configured to receive the user request from the client, a mapping module configured to retrieve mapping data corresponding to the user request from the database based on the application information included in the user request received from the receiving module, data extraction module configured to receive the mapping data from the mapping module and configured to extract data corresponding to at least one entity mapped to the mapping data from the BIM data file, and a transmission module configured to receive the extracted data from the data extraction module and configured to transmit the data to the client.

The at least one entity mapped to the mapping data may include an upper entity and a lower entity associated with the upper entity, and the upper entity and the lower entity may be in the hierarchical structure. The BIM data providing system may further include a file generating module configured to generate an IFC file including the extracted data. The transmission module may transmit the IFC file to the client.

The at least one entity mapped to the mapping data may include a first upper entity, a second upper entity, a plurality of first lower entities associated with the first upper entity, and a plurality of second lower entities associated with the second upper entity. The data extraction module may compare the first lower entities with the second lower entities, and when an overlap exists between the first and the second entities, the data extraction module may not repeatedly extract data corresponding to an overlapping lower entity.

According to still another aspect of the inventive concept, provided is a building information system including a first memory configured to store a computer program, a second memory configured to store a BIM data file including a plurality of entities in a hierarchical structure and mapping data mapped to at least one of the plurality of the entities, and a processor configured to execute the computer program. When the computer program is executed, the processor may search for mapping data corresponding to a user request in the second memory based on the user request input through an input device, extract data corresponding to at least one entity mapped to the searched mapping data from the BIM data file, and display the extracted data on a display.

According to still another aspect of the inventive concept, provided is a method of providing data using a BIM server. The method includes receiving building information regarding a target building and simulation type information regarding a type of a wanted simulation from a client, searching for data corresponding to the building information and the simulation type information in a BIM data file stored in a database, selecting an application provider computer corresponding to the simulation type information among a plurality of application provider computers, each performing different simulations, transmitting the searched data to the selected application provider computer and receiving result data corresponding to a result of miming the simulation based on the searched data from the application provider computer and transmitting the result data to the client.

The searching for the data may include retrieving the data from the BIM data file based on mapping data corresponding to the building information and the simulation type information.

After the selecting the application provider computer, the method may further include generating a list of data additionally needed by the application provider computer to run the simulation and transmitting the list to the client and receiving data corresponding to the list from the client. The transmitting the searched data may include transmitting the searched data and the data received from the client to the application provider computer.

The transmitting the result data may include converting a format of the result data and transmitting the result data to the client in the converted format. The simulation may be related to at least one of a design, a construction, and a maintenance of the target building corresponding to the searched data. The BIM data file may be in at least one of an IFC format and a text format.

According to still another aspect of the inventive concept, provided is a method of providing data using a BIM server. The method includes receiving building information regarding a target building and simulation type information regarding a type of a wanted simulation from a client, searching for a BIM data file corresponding to the building information and the simulation type information in a database, selecting an application provider computer corresponding to the simulation type information among a plurality of application provider computers, each performing different simulations, transmitting the BIM data file to the selected application provider computer, receiving result data corresponding to a result of miming the simulation based on the BIM data file from the application provider computer, and transmitting the result data to the client.

After the selecting the application provider computer, the method may further include generating a list of data additionally needed by the application provider computer to run the simulation and transmitting the list to the client, receiving data corresponding to the list from the client, and editing the BIM data file using the received data. The transmitting the BIM data file may include transmitting the edited BIM data file to the application provider computer.

The transmitting the result data may include converting a format of the result data and transmitting the result data in the converted format to the client. The simulation may be related to at least one of a design, a construction, and a maintenance of the target building corresponding to the BIM data file.

DETAILED DESCRIPTION OF THE EMBODIMENTS

Figure 1:
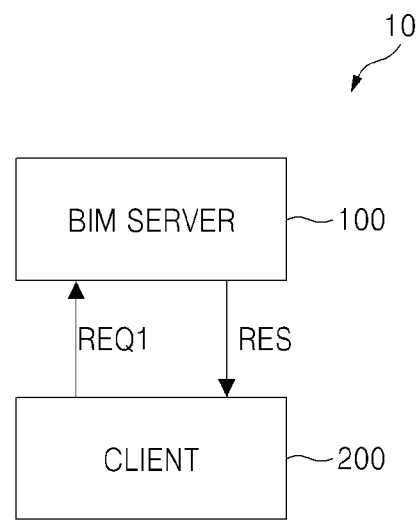
FIG. 1 is a block diagram of a building information modeling (BIM) data providing system according to an exemplary embodiment of the inventive concept.

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Hereinafter, the term "module" may indicate the functional and structural combination between hardware and software for driving the hardware. Accordingly, the module may indicate a logical unit or group of a program code and a hardware resource for performing the program code.

The term "database (DB)" may indicate the functional and structural combination between software and hardware which stores information. The DB may be implemented by at least one table. A DB management system (DBMS) may also be provided to search, store, and manage information in the DB. The DB may be implemented in various forms, such as a linked-list, a tree, and a relational DB. The DB may include any data storage medium and data structure that can be used to store information.

FIG. 1 is a block diagram of a building information modeling (BIM) data providing system 10 according to an exemplary embodiment of the inventive concept. Referring to FIG. 1, the BIM data providing system 10 includes a BIM server 100 and a client 200. The BIM data providing system 10 may be a web-based system.

The BIM server 100 may store information about each of a plurality of buildings in a form of a BIM data file. The BIM data file may be any type of file that can contain information about a building. The format of the BIM data file may be an Industry Foundation Classes (IFC). In addition to the IFC format, it should be noted that the BIM data file may be any type of format in which the BIM data can be generated using modeling tools used in BIM.

The BIM data file may include a plurality of entities in a hierarchical structure. An entity in the BIM may be a significant information unit.

The BIM server 100 may extract particular information about a certain building from the BIM data file and provide the extracted information to the client 200. The BIM server 100 may provide the extracted information to the client 200 as a response RES to a user request REQ1 of the client 200.

The client 200 may request the particular information about the certain building to the BIM server 100. The client 200 may transmit the user request REQ1 to the BIM server 100 to request the information. The user request REQ1 will be described in detail with reference to FIG. 3 later.

The client 200 may be implemented in a personal computer (PC), a tablet PC, or a laptop computer. Alternatively, the client 200 may be implemented in a portable device such as a cellular phone, a smart phone, or a tablet PC. The client 200 may communicate data with the BIM server 100 through a wired or wireless Internet network.

Figure 2:
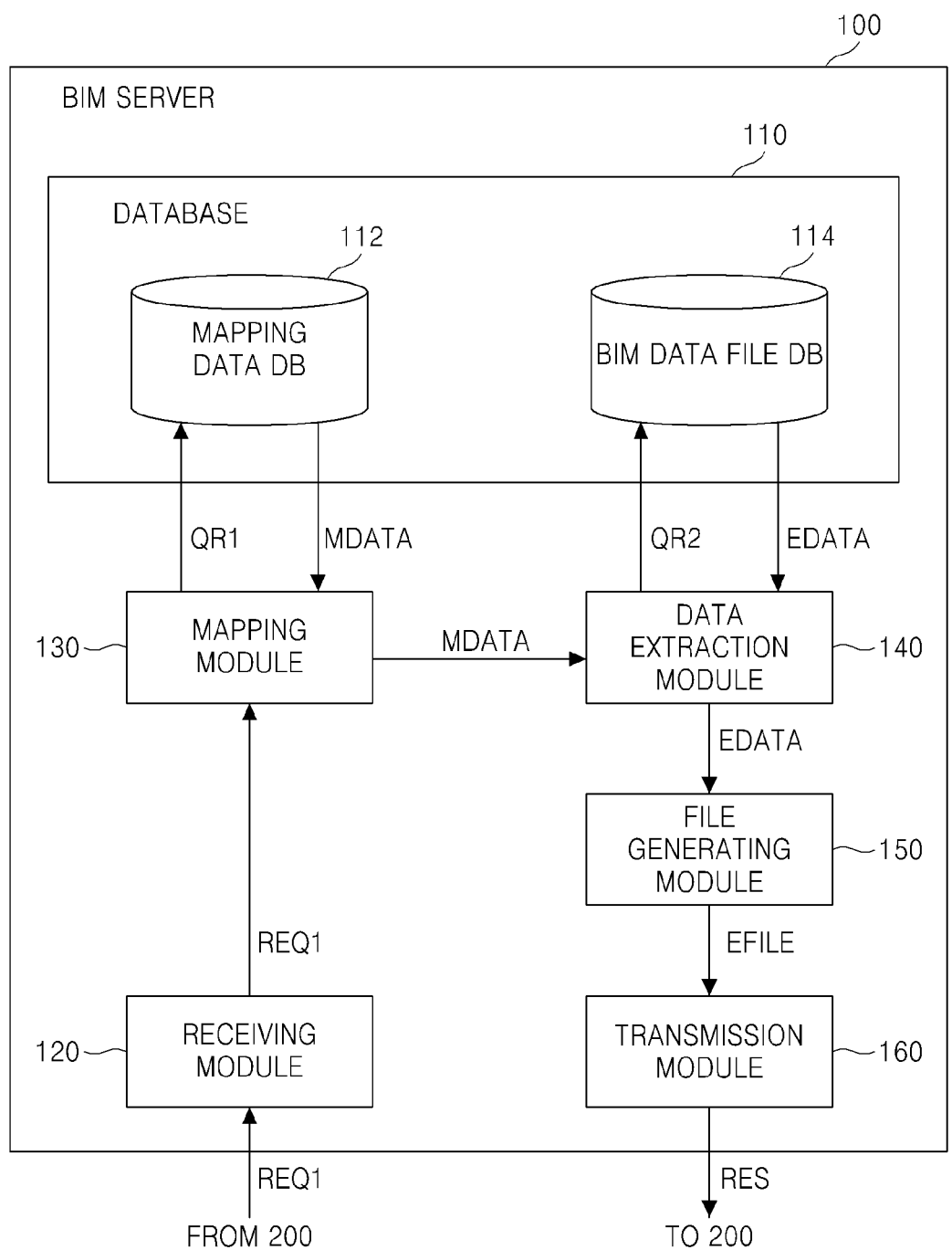
FIG. 2 is a block diagram of a BIM server illustrated in FIG. 1 according to an exemplary embodiment of the inventive concept.

FIG. 2 is a block diagram of the BIM server 100 illustrated in FIG. 1 according to an exemplary embodiment of the inventive concept. Referring to FIG. 2, the BIM server 100 includes a database (DB) 110, a receiving module 120, a mapping module 130, data extraction module 140, and a transmission module 160. The BIM server 100 may also include a file generating module 150.

The DB 110 may include mapping data DB 112 and a BIM data file DB 114. The mapping data DB 112 may store mapping data. The mapping data may be mapped to at least one of a plurality of entities included in the BIM data file. The mapping data may be used to extract data from the BIM data file. The BIM data file DB 114 may store a plurality of BIM data files.

The receiving module 120 may receive the user request REQ1 from the client 200.

The mapping module 130 may retrieve mapping data MDATA corresponding to the user request REQ1 from the mapping data DB 112 based on the user request REQ1. The mapping module 130 may generate a first query QR1 for requesting the mapping data MDATA based on the user request REQ1 received from the receiving module 120 and transmit the first query QR1 to the mapping data DB 112. In this case, the mapping data DB 112 may transmit the mapping data MDATA corresponding to the first query QR1 to the mapping module 130 in response to the first query QR1. Generating the first query QR1 to retrieve the mapping data MDATA from the mapping data DB 112 is merely an example, and the inventive concept is not limited to this example.

The data extraction module 140 may receive the mapping data MDATA from the mapping module 130 and extract, from the BIM data file DB 114, data EDATA corresponding to at least one entity mapped to the mapping data MDATA. The data extraction module 140 may generate a second query QR2 for extracting the data EDATA based on the mapping data MDATA and transmit the second query QR2 to the BIM data file DB 114. In this case, the BIM data file DB 114 may extract the data EDATA in response to the second query QR2 and transmit the data EDATA to the data extraction module 140. Generating the second query QR2 to extract the data EDATA from the BIM data file DB 114 is merely an example, and the inventive concept is not limited to this example. The data extraction module 140 may extract the data EDATA from a plurality of BIM data files.

The file generating module 150 may receive the extracted data EDATA from the data extraction module 140 and generate a sub BIM data file EFILE including the extracted data EDATA. The sub BIM data file may be an IFC file. The transmission module 160 may receive the sub BIM data file EFILE from the file generating module 150 and transmit the sub BIM data file EFILE to the client 200 as the response RES to the user request REQ1.

In an alternative embodiment, the BIM server 100 may not include the file generating module 150 and the transmission module 160 may receive the extracted data EDATA from the data extraction module 140. In this case, the transmission module 160 may transmit the extracted data EDATA to the client 200 as the response RES to the user request REQ1.

Figure 3:
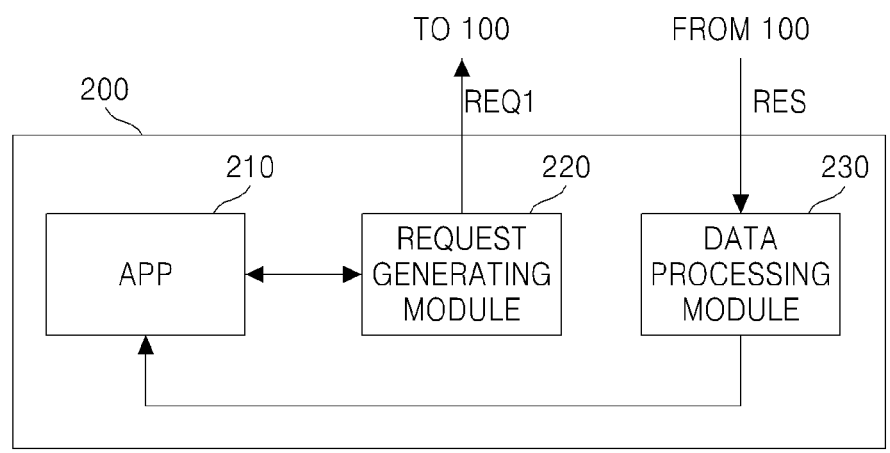
FIG. 3 is a block diagram of a client illustrated in FIG. 1 according to an exemplary embodiment of the inventive concept.

FIG. 3 is a block diagram of the client 200 illustrated in FIG. 1 according to an exemplary embodiment of the inventive concept. Referring to FIGS. 1 through 3, the client 200 may include a request generating module 220 and data processing module 230.

The request generating module 220 may generate the user request REQ1 and transmit the user request REQ1 to the BIM server 100.

The request generating module 220 may generate the user request REQ1 based on a type of an application 210, which is being executed by the client 200 and requires building information. In this case, the user request REQ1 may include information about a target building, which is required by the application 210, and application information, e.g., information about the type of the application 210.

The user request REQ1 may be a script including, for example, the above types of information. The script may be created in an extensible markup language (XML). The mapping module 130 may retrieve the mapping data MDATA from the mapping data DB 112 based on the information about the type of the application 210.

The mapping data MDATA may define a target to be extracted from the BIM data file by the client 200 or the application 210 running in the client 200 and may be stored beforehand in the mapping data DB 112 in a form of a program.

The data processing module 230 may receive the response RES from the BIM server 100 and process the response RES into a form that can be used in the application 210. Alternatively, the processing of the response RES may be performed in the BIM server 100 and the data processing module 230 may receive the response RES that has already been processed into the form that can be used in the application 210.

Figure 4:
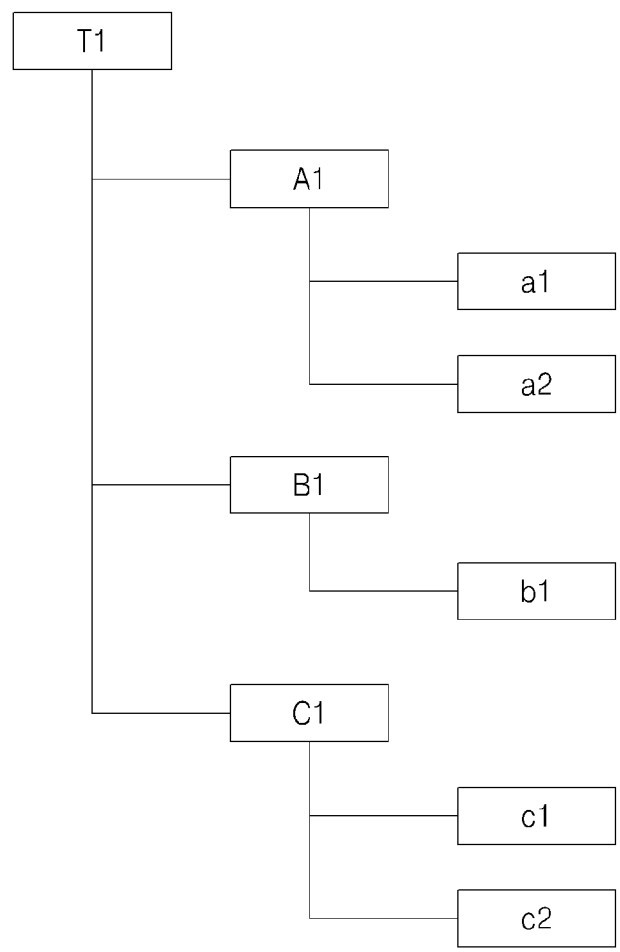
FIG. 4 is a conceptual diagram of a structure of a BIM data file according to an exemplary embodiment of the inventive concept.

FIG. 4 is a conceptual diagram of a structure of a BIM data file according to an exemplary embodiment of the inventive concept. Referring to FIGS. 2 and 4, an entire file T1 may include a plurality of entities A1, B1, C1, a1, a2, b1, c1, and c2.

For the sake of illustration, it is assumed that two mapping data MDATA are provided for the entire file T1 and that a first mapping data is mapped to the entity A1 and second mapping data is mapped to the entities B1 and C1.

When the data extraction module 140 receives the first mapping data, it may extract data, which corresponds to the entity A1 to which the first mapping data is mapped and lower entities a1 and a2 of the entity A1, from the entire file T1 based on the first mapping data.

When the data extraction module 140 receives the second mapping data, it may extract data, which corresponds to the entities B1 and C1 to which the second mapping data is mapped and lower entities b1, c1 and c2 of the entities B1 and C1, from the entire file T1 based on the second mapping data. In an alternative embodiment, the mapping data MDATA may be mapped to the upper entity A1 and all of lower entities a1 and a2 thereof In this case, the upper entity A1 may be one of entities, such as a wall, a space, a stair, and a slab, into which a structure of a building is classified by a function thereof.

Figure 5:
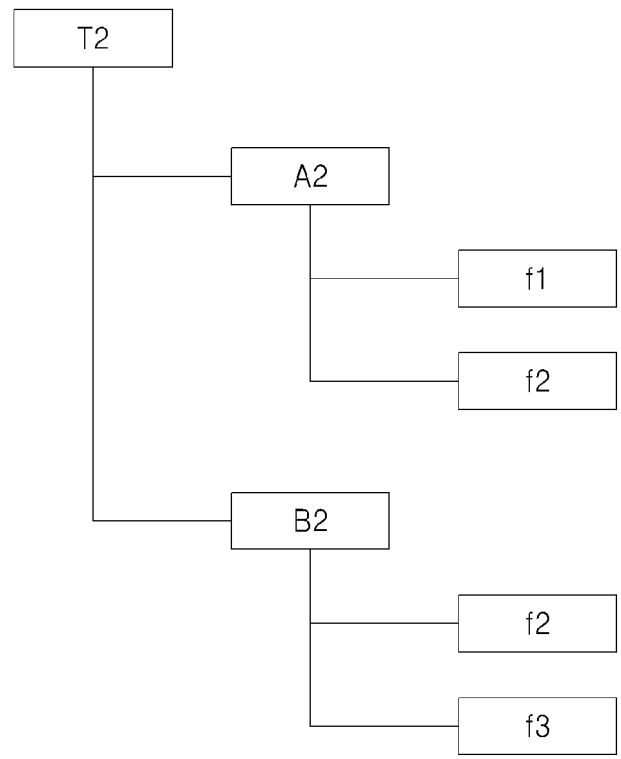
FIG. 5 is a conceptual diagram of a structure of a BIM data file according to another exemplary embodiment of the inventive concept.

FIG. 5 is a conceptual diagram of a structure of a BIM data file according to another exemplary embodiment of the inventive concept. Referring to FIGS. 2 and 5, an entire file T2 may include a plurality of entities A2, B2, f1, f2 and f3. For the sake of illustration, it is assumed that the mapping data MDATA for the entire file T2 is mapped to the upper entity A2 and the upper entity B2.

The data extraction module 140 may extract data, which corresponds to the upper entities A2 and B2 to which the mapping data MDATA is mapped and lower entities f1, f2 and f3 of the entities A2 and B2, from the entire file T2 based on the mapping data MDATA. In this case, the data extraction module 140 may compare the lower entities f1 and f2 associated with the upper entity A2 with the lower entities f2 and f3 associated with the upper entity B2, and when there is an overlap of the same lower entity, i.e., f2 in this exemplary embodiment, determined as a result of the comparison, the data extraction module 140 may not repeatedly extract data with respect to the lower entity f2. In other words, with respect to the lower entity f2 associated with the two different upper entities A2 and B2, the data may be extracted only once.

Figure 6:
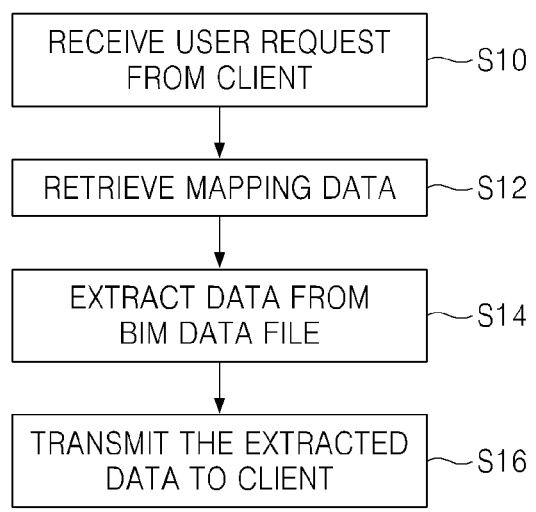
FIG. 6 is a flowchart of a method of providing data included in a BIM data file according to an exemplary embodiment of the inventive concept.

FIG. 6 is a flowchart of a method of providing data included in a BIM data file according to an exemplary embodiment of the inventive concept. Referring to FIGS. 2, 3, and 6, the receiving module 120 may receive the user request REQ1 from the client 200 in step S10.

The mapping module 130 may retrieve the mapping data MDATA corresponding to the user request REQ1 from the mapping data DB 112 based on the user request REQ1 in step S12. The data extraction module 140 may receive the mapping data MDATA from the mapping module 130 and extract the data EDATA, which corresponds to at least one entity to which the mapping data MDATA is mapped, from the BIM data file stored in the BIM data file DB 114 in step S14.

The transmission module 160 may receive the extracted data EDATA from the data extraction module 140 and transmit the extracted data EDATA to the client 200 as the response RES to the user request REQ1 in step S16.

The BIM server 100 may process the extracted data EDATA and transmit the processed data to the client 200. In this case, the data processing module 230 may receive the response RES that has been processed into the form that can be used in the application 210. The response RES may be processed based on the extracted data EDATA and may include only a result value requested by the client 200 or the application 210 running in the client 200.

Figure 7:
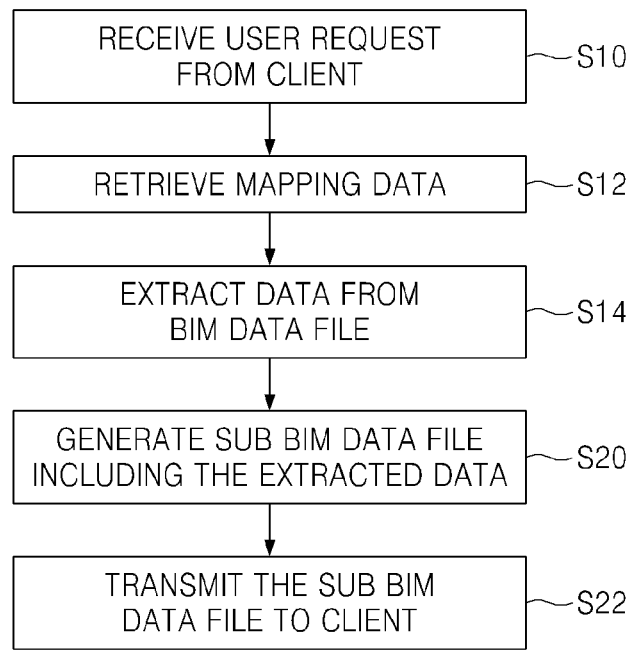
FIG. 7 is a flowchart of a method of providing data included in a BIM data file according to another exemplary embodiment of the inventive concept.

FIG. 7 is a flowchart of a method of providing data included in a BIM data file according to another exemplary embodiment of the inventive concept. Referring to FIGS. 2 and 7, the file generating module 150 may receive the extracted data EDATA from the data extraction module 140 and generate the sub BIM data file EFILE, for example, in the IFC format, including the extracted data EDATA in step S20.

The transmission module 160 may receive the sub BIM data file EFILE from the data file generating module 150 and transmit the sub BIM data file EFILE to the client 200 as the response RES to the user request REQ1 in step S22.

Figure 8:
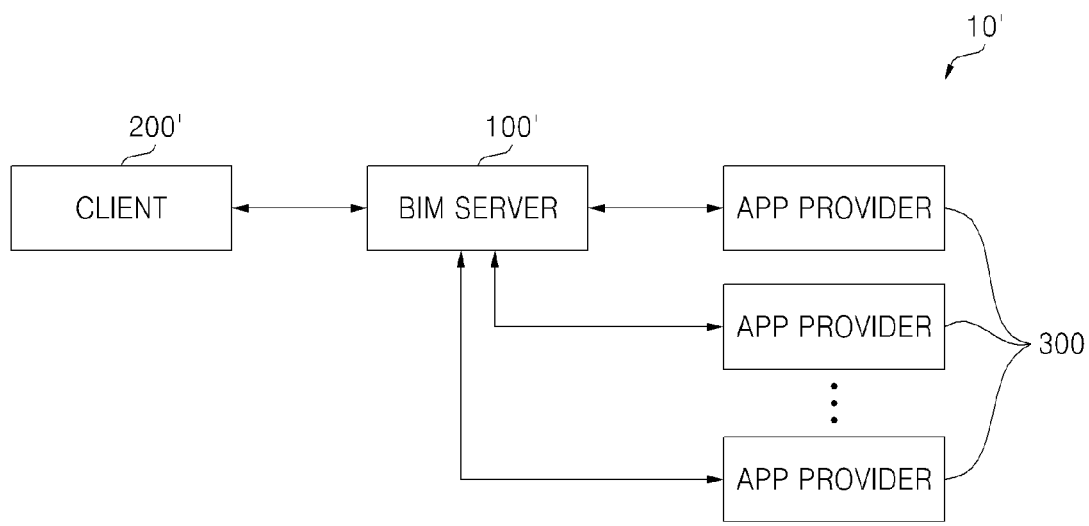
FIG. 8 is a block diagram of data providing system according to an exemplary embodiment of the inventive concept.

FIG. 8 is a block diagram of data providing system 10' according to an exemplary embodiment of the inventive concept. Referring to FIG. 8, the data providing system 10' may include a BIM server 100', a client 200', and a plurality of application providers 300.

The client 200' may transmit a user request to the BIM server 100'. The user request may include information about a target building to be simulated, information about mapping data, and/or information about a type of simulation to be run. The information about the type of simulation may include information about a type of an application program or information about an application provider providing the application program among the application providers 300.

The BIM server 100' may receive the user request from the client 200' and transmit a file or data necessary to process the user request to at least one of the application providers 300.

A structure and an operation of the BIM server 100' will be described in detail with reference to FIGS. 9 through 14 later.

Each of the application providers 300 may be a PC or a server operated by a provider that provides the application program. Each of the application providers 300 may provide the application program that executes a different simulation. The application providers 300 may execute the application program based on the data or the file transmitted from the BIM server 100' and may generate result data according to a result of the execution thereof.

For instance, the application program may simulate a sunlight entering the target building corresponding to the data or the file transmitted from the BIM server 100'. In this case, the data or the file transmitted from the BIM server 100' may include information about a number of stories and a position of the target building and/or a distance between the target building and another building. For another instance, the application program may simulate energy efficiency of the target building corresponding to the data or the file transmitted from the BIM server 100'. In this case, the data or the file may include information about a material and/or an area of an envelope of the target building.

For still another instance, the application program may simulate a cost of constructing the target building corresponding to the data or the file transmitted from the BIM server 100'. In this case, the data or the file may include information about a quantity (or mass) of a material used for the building and/or a cost of a unit quantity (or mass) of the material.

For still another instance, the application program may simulate maintenance of facilities in the target building corresponding to the data or the file transmitted from the BIM server 100'. In this case, the data or the file may include information about time when each facility is installed (or replaced) and a lifespan of the corresponding facility.

For still another instance, the application program may simulate structures of the target building, for example, whether a beam overlaps a pipe, in a stage of designing the target building, corresponding to the data or the file transmitted from the BIM server 100'. For still another instance, the application program may simulate a sequence and a schedule of work processes for the target building corresponding to the data or the file transmitted from the BIM server 100'. In this case, the data or the file may include information about an area of each floor (or story) of the target building and an area of a wall in each floor (or story).

The result data of the simulation may be transmitted to the client 200' through the BIM server 100'.

Each of the application providers 300 may be implemented in a computer that can execute the application program. The computer may include a computer system that can operate as the server.

Figure 9:
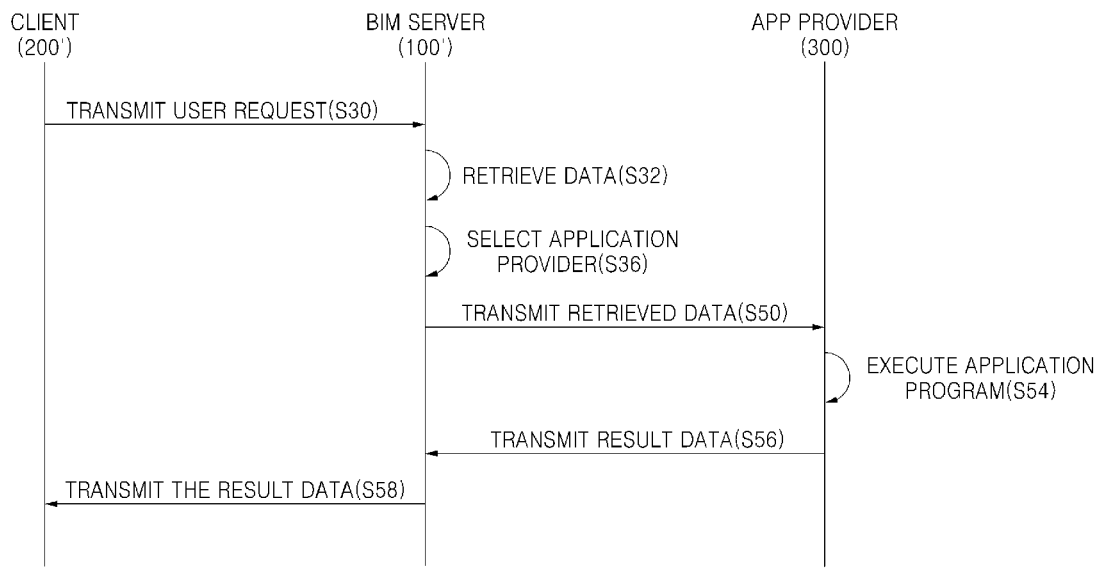
FIG. 9 is a diagram of data flow in a method of providing data using a BIM server illustrated in FIG. 8 according to an exemplary embodiment of the inventive concept.
Figure 10:
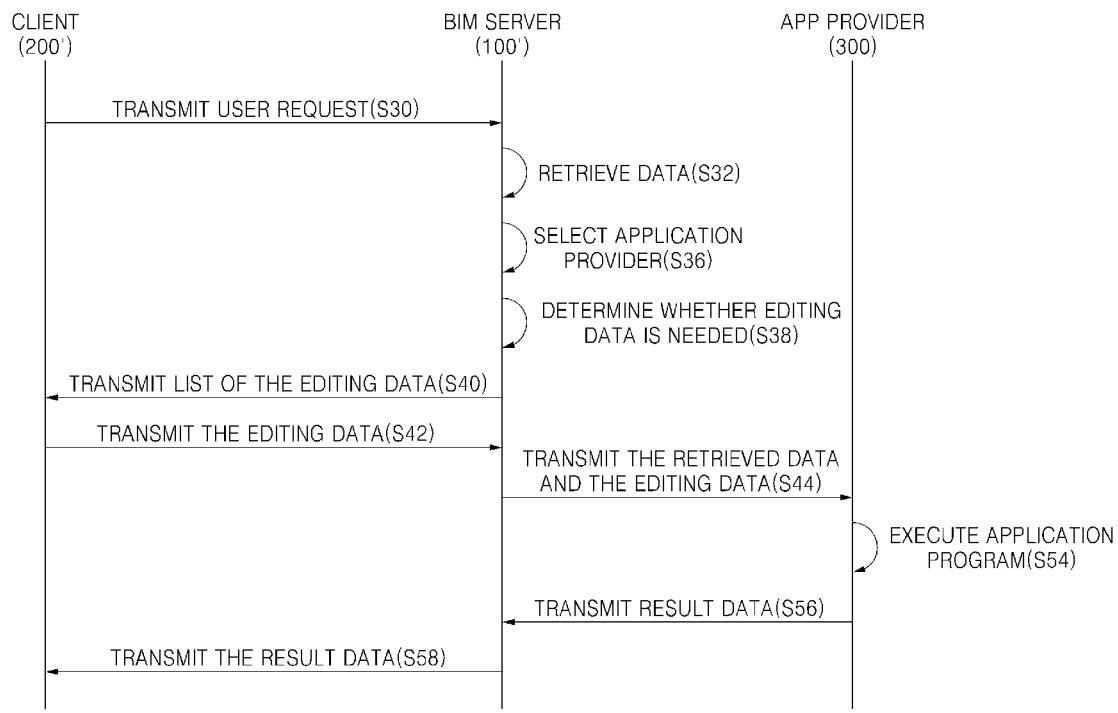
FIG. 10 is a diagram of data flow in a method of providing data using the BIM server illustrated in FIG. 8 according to another exemplary embodiment of the inventive concept.
Figure 11:
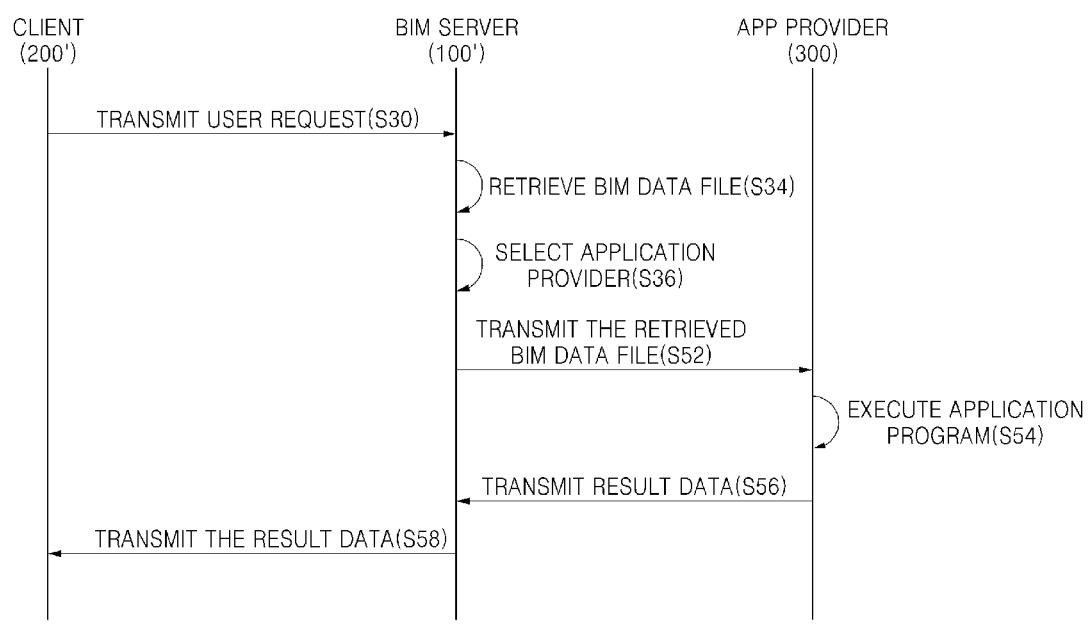
FIG. 11 is a diagram of data flow in a method of providing data using the BIM server illustrated in FIG. 8 according to still another exemplary embodiment of the inventive concept.
Figure 12:
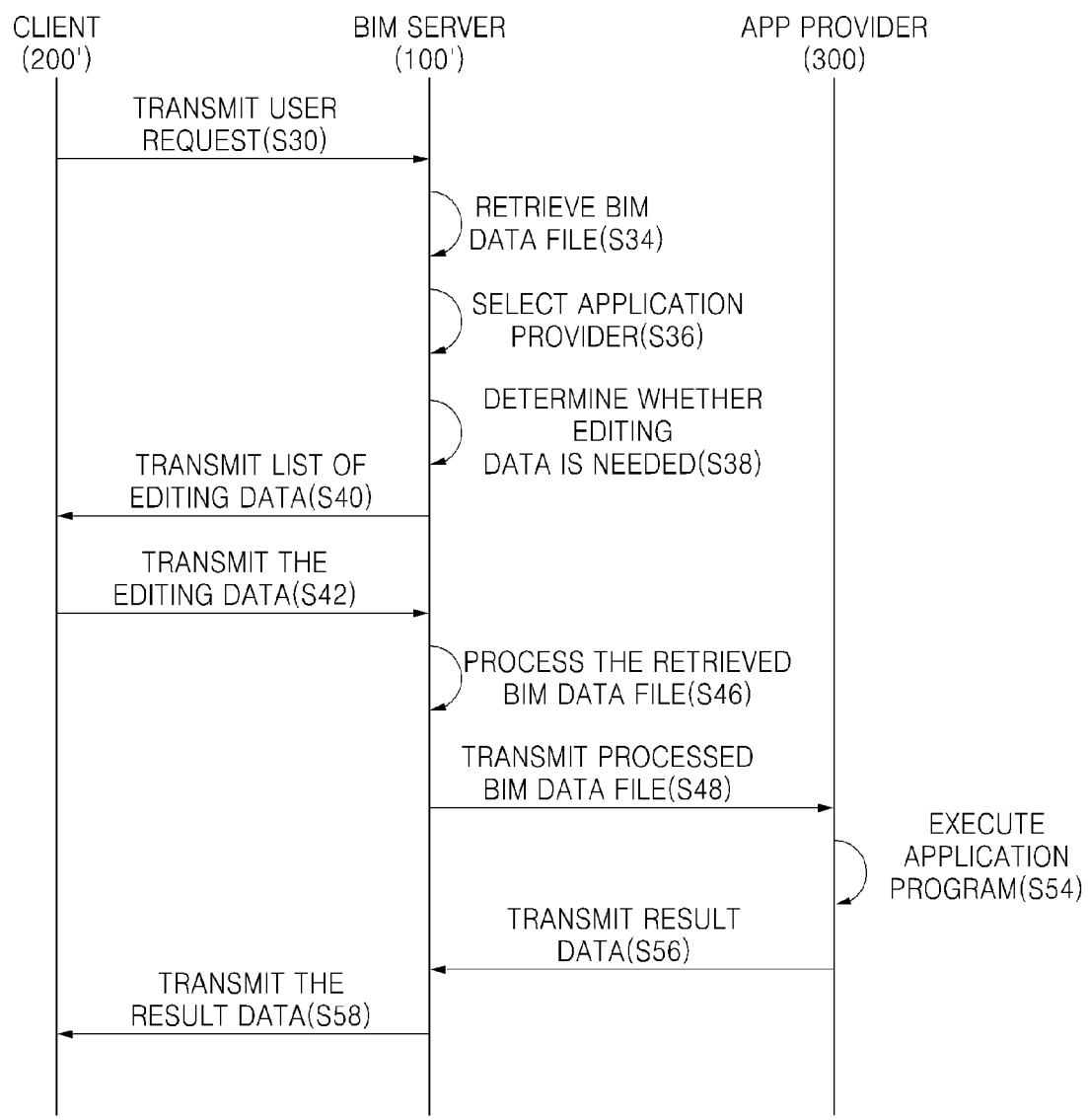
FIG. 12 is a diagram of data flow in a method of providing data using the BIM server illustrated in FIG. 8 according to still another exemplary embodiment of the inventive concept.

FIG. 9 is a diagram of data flow in a method of providing data using the BIM server 100' illustrated in FIG. 8 according to an exemplary embodiment of the inventive concept. FIG. 10 is a diagram of data flow in a method of providing data using the BIM server 100' illustrated in FIG. 8 according to another exemplary embodiment of the inventive concept. FIG. 11 is a diagram of data flow in a method of providing data using the BIM server 100' illustrated in FIG. 8 according to still another exemplary embodiment of the inventive concept. FIG. 12 is a diagram of data flow in a method of providing data using the BIM server 100' illustrated in FIG. 8 according to still another exemplary embodiment of the inventive concept.

Referring to FIG. 9, the client 200' may transmit the user request to the BIM server 100' in step S30. The user request may include building information regarding the target building and/or simulation type information regarding a type of a wanted simulation.

The BIM server 100' may retrieve data based on the building information and the simulation type information in step S32. Alternatively, the BIM server 100' may extract data corresponding to the building information and the simulation type information from the BIM data file. The BIM server 100' may select the application provider 300 corresponding to the simulation type information in step S36.

The application provider 300 illustrated in FIGS. 9 through 12 may be the application provider that the BIM server 100' selects among the application providers 300 illustrated in FIG. 8 based on the simulation type information.

Steps S32 and S36 will be described in detail with reference to FIGS. 13 and 14 later.

The BIM server 100' may transmit the retrieved data to the application provider 300 in step S50. The application provider 300 may execute the application program for running the simulation based on the data and generate the result data according to the execution in step S54. The application provider 300 may transmit the result data to the BIM server 100' in step S56.

The BIM server 100' may transmit the result data to the client 200' in step S58. The BIM server 100' may convert the result data into a form requested by the client 200', for example, a format requested by the client 200', and transmit the converted result data to the client 200'.

Referring to FIG. 10, the BIM server 100' may determine whether an editing data is needed by the application provider 300 to run the simulation in addition to the retrieved data in step S38.

For instance, the editing data may refer to an extrdata needed by the application provider 300 to run the simulation. For another instance, the editing data may refer to data needed by the BIM server 100' to edit the retrieved data or BIM data file. The BIM server 100' may generate a list of additionally needed data. The BIM server 100' may transmit the list to the client 200' in step S40.

The BIM server 100' may receive the editing data corresponding to the list from the client 200' in step S42 and may transmit the editing data to the application provider 300 together with the data retrieved based on the building information and the simulation type information in step S44.

Referring to FIG. 11, the BIM server 100' may retrieve the BIM data file based on the building information and the simulation type information in step S34 and may transmit the BIM data file to the application provider 300 in step S52. The application provider 300 may execute the application program for running the simulation based on the BIM data file and generate the result data according to the result of the execution in step S54.

Referring to FIG. 12, the BIM server 100' may receive the editing data corresponding to the list of the additionally needed data from the client 200' in step S42 and may process, for example, to edit or revise the BIM data file using the editing data in step S46. Alternatively, the BIM server 100' may embed the editing data in BIM data file.

The BIM server 100' may transmit the processed, for example, revised BIM data file to the application provider 300 in step S48. Alternatively, the BIM server 100' may transmit the BIM data file including the editing data received from the client 200' to the application provider 300.

Figure 13:
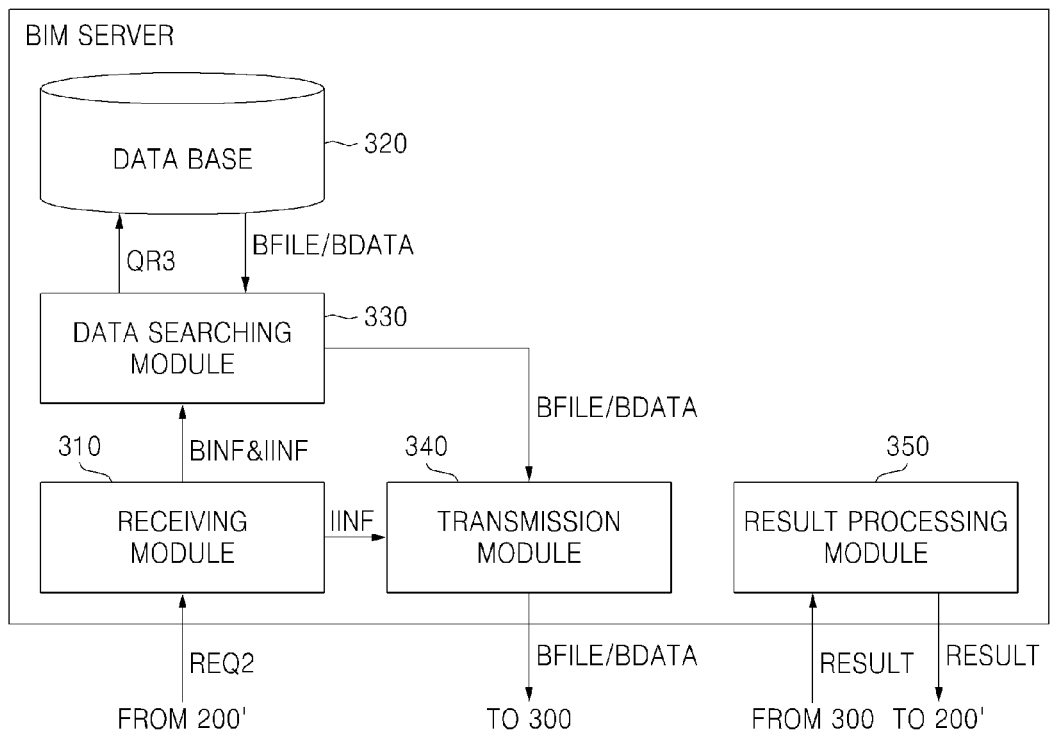
FIG. 13 is a block diagram of an example of the BIM server illustrated in FIG. 8.

FIG. 13 is a block diagram of an example of the BIM server 100' illustrated in FIG. 8. FIG. 14 is a block diagram of another example of the BIM server 100' illustrated in FIG. 8.

Referring to FIGS. 8 through 13, a BIM server 100'A illustrated in FIG. 13 may include a receiving module 310, a DB 320, data searching module 330, a transmission module 340, and a result processing module 350.

A user request REQ2 may include building information BINF regarding the target building and simulation type information IINF regarding the type of the wanted simulation. The building information BINF may indicate the target building of the simulation, a number of stories of the target building, and/or a particular area of the target building. The simulation type information IINF may indicate the type of the application program to be executed and the application provider 300 providing the application program.

The receiving module 310 may receive the user request REQ2 from the client 200' and may transmit the building information BINF and the simulation type information IINF included in the user request REQ2 to the data searching module 330. The receiving module 310 may also transmit the simulation type information IINF included in the user request REQ2 received from the client 200' to the transmission module 340.

In an alternative embodiment, the BIM server 100'A may not include the receiving module 310. In this case, the data searching module 330 may directly receive the building information BINF and the simulation type information IINF from the client 200' and the transmission module 340 may directly receive the simulation type information IINF from the client 200'.

The DB 320 may store a plurality of BIM data files. The BIM data files may be data files in the IFC format or data files in a text format. The data searching module 330 may generate a query QR3 for requesting data BDATA or a BIM data file BFILE based on the building information BINF and the simulation type information IINF and may transmit the query QR3 to the DB 320.

When the simulation type information IINF indicates a simulation of the energy efficiency of the target building, the data searching module 330 may search for the data BDATA or the BIM data file BFILE related to a material and an area of the envelope of the target building indicated by the building information BINF. The DB 320 may transmit the data BDATA or the BIM data file BFILE to the data searching module 330 in response to the query QR3.

Generating the query QR3 to search for the data BDATA or the BIM data file BFILE in the DB 320 is merely an example, and the inventive concept is not limited to this example.

The data searching module 330 may transmit the data BDATA or the BIM data file BFILE to the transmission module 340. Alternatively, the data BDATA or the BIM data file BFILE may be directly transmitted from the DB 320 to the transmission module 340.

The BIM server 100'A may also include a module (not shown) that processes the BIM data file BFILE using data additionally received from the client 200'. The module may edit the BIM data file BFILE using the additionally received data.

The transmission module 340 may select the application provider 300 corresponding to the simulation type information IINF in step S36 and may transmit the data BDATA or the BIM data file BFILE to the selected application provider 300 in step S50 or S52. The transmission module 340 may convert the data BDATA or the BIM data file BFILE into the form required by the application provider 300, for example, the format required by the application provider 300, and transmit the converted data BDATA or BIM data file BFILE to the application provider 300.

The result processing module 350 may receive result data RESULT corresponding to the result of executing the application program based on the data BDATA or the BIM data file BFILE from the application provider 300 in step S56. For instance, when the application program runs the simulation of the energy efficiency of the target building, the result data RESULT may include information about the energy efficiency of the target building.

The result processing module 350 may transmit the result data RESULT to the client 200' in step S58. The result processing module 350 may convert the result data RESULT into the form required by the client 200', for example, the format required by the client 200', and transmit the converted result data RESULT to the client 200'.

Figure 14:
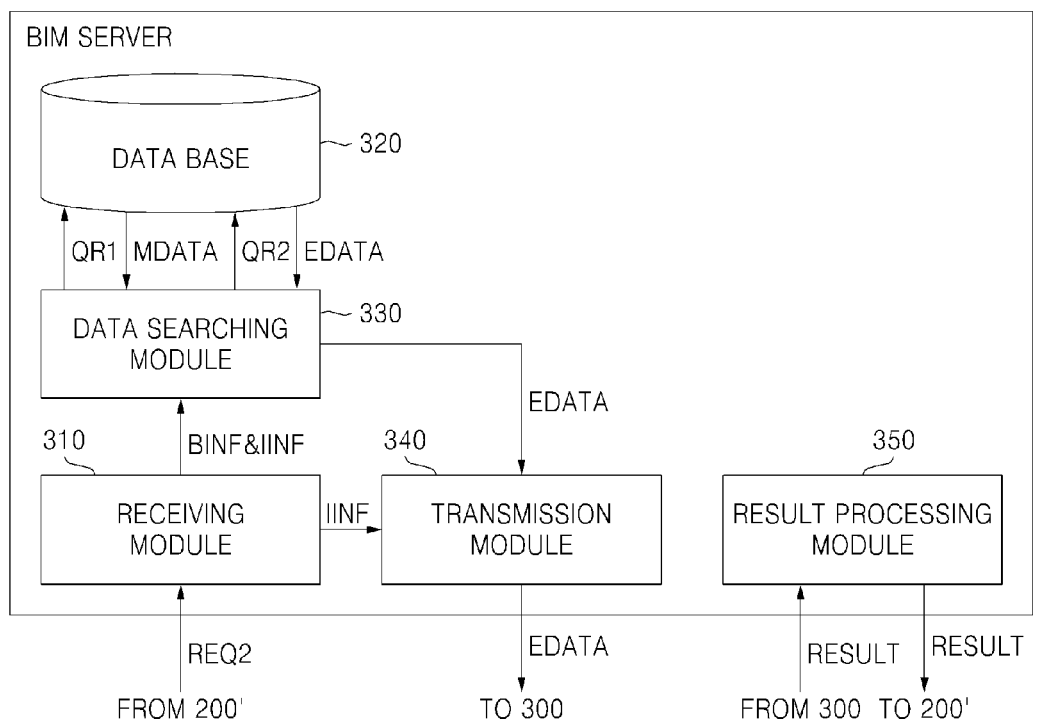
FIG. 14 is a block diagram of another example of the BIM server illustrated in FIG. 8.

In FIG. 13 and FIG. 14, the receiving module 310, the data searching module 330, the transmission module 340, and the result processing module 350 are illustrated to be functionally and logically separated from one another. However, it should be noted the above elements are not necessarily implemented in separate physical devices or created in separate codes.

Referring to FIGS. 9 and 14, a BIM server 100'B illustrated in FIG. 14 may extract the extraction data EDATA from the BIM data file based on the building information BINF and the simulation type information IINF included in the user request REQ2 and may transmit the extraction data EDATA to the application provider 300.

The DB 320 may store a plurality of BIM data files and a plurality of mapping data MDATA. The BIM data files may be in the IFC format or the text format.

The data searching module 330 may generate the query QR1 for requesting the mapping data MDATA corresponding to the building information BINF and the simulation type information IINF and transmit the query QR1 to the DB 320. For instance, when the simulation type information IINF indicates the simulation of the energy efficiency of the target building, the mapping data MDATA may be data for extracting the extraction data EDATA related to the material and the area of the envelope of the target building indicated by the building information BINF.

The DB 320 may transmit the mapping data MDATA to the data searching module 330 in response to the query QR1. The mapping data MDATA may be used to extract the extraction data EDATA from the BIM data file. This has been described in detail with reference to FIGS. 8 and 9.

The data searching module 330 may generate the query QR2 for requesting the extraction data EDATA based on the mapping data MDATA and transmit the query QR2 to the DB 320. The DB 320 may extract the extraction data EDATA from the BIM data file corresponding to the query QR2 in response to the query QR2 and transmit the extraction data EDATA to the data searching module 330.

Alternatively, the extraction data EDATA may be transmitted from the DB 320 directly to the transmission module 340. A procedure for searching for the extraction data EDATA from the DB 320 may be substantially the same as the procedure for retrieving the data EDATA from the DB 110 illustrated in FIG. 2.

Generating the query QR1 or QR2 for retrieving the mapping data MDATA or the extraction data EDATA from the DB 320 is merely an example. The inventive concept is not limited to this example.

The data searching module 330 may transmit the extraction data EDATA to the transmission module 340. The transmission module 340 may select the application provider 300 corresponding to the simulation type information IINF in step S36 and transmit the extraction data EDATA to the selected application provider 300 in step S50.

Figure 15:
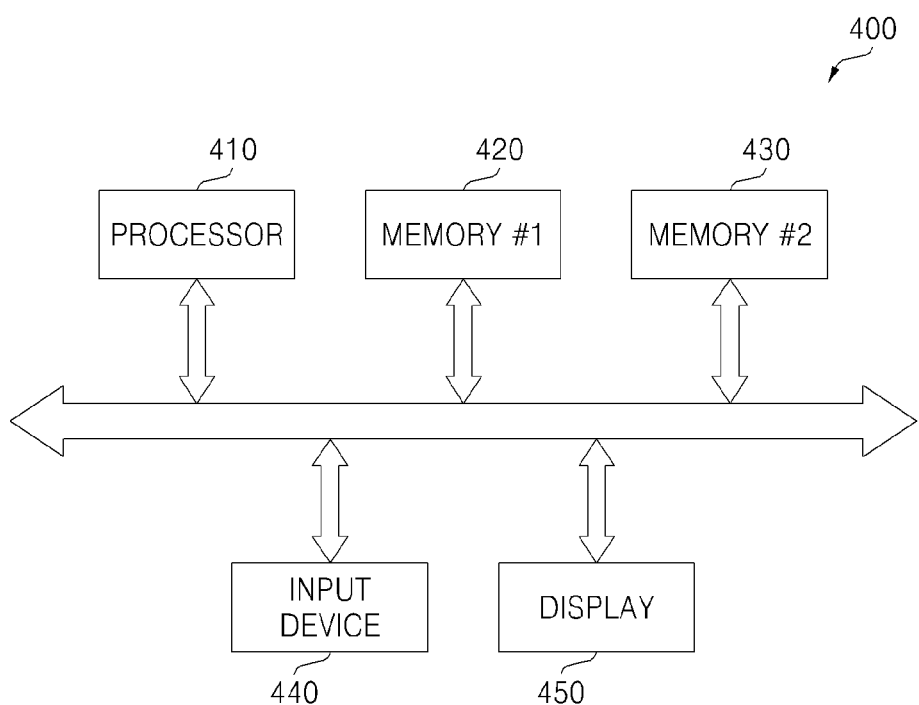
FIG. 15 is a block diagram of a BIM data providing system according to another exemplary embodiment of the inventive concept.

FIG. 15 is a block diagram of a BIM data providing system 400 according to another exemplary embodiment of the inventive concept. Referring to FIG. 15, the BIM data providing system 400 may include a processor 410, a first memory 420, a second memory 430, an input device 440, and a display 450. The BIM data providing system 400 may be implemented in the PC, the tablet PC or the laptop computer.

The processor 410 controls an overall operation of the BIM data providing system 400. The first memory 420 may be used as an operation memory. The first memory 420 may be implemented in a non-volatile memory such as read-only memory (ROM) or a volatile memory such as static random access memory (SRAM). The second memory 430 may store the mapping data and/or a plurality of the BIM data files.

The processor 410 may execute a computer program stored in the first memory 420 in response to a user request input through the input device 440. When the computer program is executed, the processor 410 may retrieve the mapping data corresponding to the user request from the second memory 430, extract data corresponding to at least one entity mapped to the mapping data from the BIM data files, and display the extracted data on the display 450.

The input device 440 may be implemented in a pointing device such as a touch pad or a computer mouse, a keypad, or a keyboard.

As described above, according to exemplary embodiments of the inventive concept, a requested data is extracted from a BIM data file using mapping data and the extracted data or a sub BIM data file including the extracted data is transmitted to a client so that a speed of responding to data request may be increased. The client receives the data extracted from the BIM data file, thereby avoiding using a storage space for an unnecessary data or processing of the data.

In addition, data necessary for executing an application is provided based on which application needs to be executed by the client, thereby making a better use of the BIM data file. Furthermore, result data indicating a result of a building simulation corresponding to a request of the client is provided using a BIM server so that the client does not require an application program for running the simulation.

Also, the client transmits building information regarding a target building and simulation type information regarding a type of a wanted simulation to the BIM server so that a result of simulating the target building may be obtained.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A method of providing data included in a first building information modeling (BIM) data file using a server, which comprises a database storing the first BIM data file including a plurality of entities in a hierarchical structure and mapping data mapped to at least one of the plurality of the entities, the method comprising:

receiving, by the server, a user request which includes application information from the client that is configured to communicate remotely with the server over a network;

retrieving mapping data corresponding to the user request from the database based on the application information included in the user request;

extracting data corresponding to at least one entity mapped to the mapping data from the first BIM data file;

generating a second BIM data file based on the extracted data, the second BIM data file being smaller than the first BIM data file; and transmitting the second BIM data file to the client over the network, wherein the application information includes a type of an application executed by the client, wherein the at least one entity mapped to the mapping data comprises a plurality of first lower entities associated with a first upper entity and a plurality of second lower entities associated with a second upper entity, and wherein the extracting comprises comparing the first lower entities with the second lower entities, and data corresponding to an overlapping lower entity between the first and the second lower entities according to a comparison result is not extracted repeatedly.

2. The method of claim 1, wherein the first upper entity and the plurality of the first lower entities are in the hierarchical structure, and wherein the second upper entity and the plurality of the second lower entities are in the hierarchical structure.

3. The method of claim 1, wherein the first and second BIM data files are industry foundation classes (IFC) files.

4. A non-transitory computer readable medium storing a computer program for performing the method of claim 1.

5. A building information modeling (BIM) data providing system comprising:

a client configured to communicate remotely with a server over a network and configured to generate a user request comprising application information regarding an application to be executed; and the server configured to transmit a response corresponding to the user request to the client over the network, the server comprising:

a database configured to store a first BIM data file comprising a plurality of entities in a hierarchical structure and mapping data mapped to at least one of the plurality of the entities;

a receiving module configured to receive the user request from the client over the network;

a mapping module configured to retrieve mapping data corresponding to the user request from the database based on the application information included in the user request received from the receiving module;

a data extraction module configured to receive the mapping data from the mapping module and configured to extract data corresponding to at least one entity mapped to the mapping data from the first BIM data file;

a file generating module configured to receive the extracted data from the mapping module and configured to generate a second BIM data file based on the extracted data, the second BIM data file being smaller than the first BIM data file; and a transmission module configured to receive the second BIM data file from the file generation module and configured to transmit the data to the client over the network, wherein the application information includes a type of the application to be executed by the client, wherein the mapping data is related to the application information, wherein the at least one entity mapped to the mapping data comprises a plurality of first lower entities associated with a first upper entity and a plurality of second lower entities associated with a second upper entity, and wherein the data extraction module compares the first lower entities with the second lower entities, and when an overlapping lower entity exists between the first and the second lower entities, the data extraction module does not repeatedly extract data corresponding to the overlapping lower entity.

6. The BIM data providing system of claim 5, wherein the first upper entity and the plurality of the first lower entities are in the hierarchical structure, wherein the second upper entity and the plurality of the second lower entities are in the hierarchical structure.

7. The BIM data providing system of claim 5, wherein the first and second BIM data files are industry foundation classes (IFC) files.

* * * * *